(12) United States Patent
Zhou

(10) Patent No.: US 10,725,673 B2
(45) Date of Patent: Jul. 28, 2020

(54) FLASH DEVICE ACCESS METHOD, APPARATUS, AND SYSTEM

(71) Applicant: Huawei Technologies Co., Ltd., Shenzhen (CN)

(72) Inventor: Guanfeng Zhou, Hangzhou (CN)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 0 days.

(21) Appl. No.: 16/242,566

(22) Filed: Jan. 8, 2019

(65) Prior Publication Data

US 2019/0146689 A1 May 16, 2019

Related U.S. Application Data

(63) Continuation of application No. PCT/CN2017/097680, filed on Aug. 16, 2017.

(30) Foreign Application Priority Data

Aug. 18, 2016 (CN) .......................... 2016 1 0686247

(51) Int. Cl.
*G06F 3/06* (2006.01)
*G11C 16/26* (2006.01)
(Continued)

(52) U.S. Cl.
CPC .............. *G06F 3/0619* (2013.01); *G06F 3/06* (2013.01); *G06F 3/0679* (2013.01);
(Continued)

(58) Field of Classification Search
None
See application file for complete search history.

(56) References Cited

U.S. PATENT DOCUMENTS 7,577,036 B2 8/2009 Sarin et al.
2008/0123419 A1 5/2008 Brandman et al.
(Continued)

FOREIGN PATENT DOCUMENTS

CN 101241760 A 8/2008
CN 101573761 A 11/2009
(Continued)

OTHER PUBLICATIONS

Machine Translation and Abstract of Chinese Publication No. CN102915770, Feb. 6, 2013, 21 pages.
(Continued)

*Primary Examiner* — Kaushikkumar M Patel
(74) *Attorney, Agent, or Firm* — Conley Rose, P.C.

(57) ABSTRACT

A flash device access method, apparatus, and system, where a flash device includes a controller and a storage array. The method includes dividing the storage array into a specific storage unit and a user storage unit, such that a storage feature of the specific storage unit is the same as that of the user storage unit, writing, by the controller, specific data into the specific storage unit, reading, by the controller, the specific data stored in the specific storage unit, determining, by the controller, a decision voltage (Vread) based on the read specific data, and reading, by the controller using the determined Vread, the user data stored in the user storage unit. Hence, incorrect determining of the data stored in the flash device may be reduced using the access method, apparatus, and system.

20 Claims, 11 Drawing Sheets

(51) Int. Cl.
*G11C 16/34* (2006.01)
*G11C 16/28* (2006.01)
*G06F 11/10* (2006.01)
*G11C 29/52* (2006.01)

(52) U.S. Cl.
CPC .......... *G06F 11/1068* (2013.01); *G11C 16/26* (2013.01); *G11C 16/28* (2013.01); *G11C 16/3404* (2013.01); *G11C 16/349* (2013.01); *G11C 16/3418* (2013.01); *G11C 29/52* (2013.01)

(56) References Cited

U.S. PATENT DOCUMENTS

| | | | |
|---|---|---|---|
| 2008/0144387 A1 | 6/2008 | Kim et al. | |
| 2008/0192541 A1* | 8/2008 | Kang | G11C 11/5642 365/185.03 |
| 2009/0273975 A1 | 11/2009 | Sarin et al. | |
| 2010/0118608 A1* | 5/2010 | Song | G11C 11/5642 365/185.11 |
| 2010/0232221 A1 | 9/2010 | Park et al. | |
| 2011/0122684 A1* | 5/2011 | Sheu | G11C 7/14 365/163 |
| 2012/0221772 A1 | 8/2012 | Seol et al. | |
| 2012/0236636 A1 | 9/2012 | Nawata | |
| 2014/0059405 A1 | 2/2014 | Syu et al. | |
| 2014/0229131 A1 | 8/2014 | Cohen et al. | |
| 2015/0052387 A1* | 2/2015 | Kern | G06F 11/1666 714/6.13 |
| 2015/0332777 A1 | 11/2015 | Yoon et al. | |

FOREIGN PATENT DOCUMENTS

| | | |
|---|---|---|
| CN | 101681679 A | 3/2010 |
| CN | 102915770 A | 2/2013 |
| CN | 103632730 A | 3/2014 |
| CN | 103985415 A | 8/2014 |
| CN | 105097028 A | 11/2015 |
| CN | 106293539 A | 1/2017 |

OTHER PUBLICATIONS

Machine Translation and Abstract of Chinese Publication No. CN106293539, Jan. 4, 2017, 36 pages.
Foreign Communication From a Counterpart Application, PCT Application No. PCT/CN2017/097680, English Translation of International Search Report dated Nov. 23, 2017, 2 pages.

* cited by examiner

FLASH DEVICE ACCESS METHOD, APPARATUS, AND SYSTEM

CROSS-REFERENCE TO RELATED APPLICATIONS

This application is a continuation of International Patent Application No. PCT/CN2017/097680 filed on Aug. 16, 2017, which claims priority to Chinese Patent Application No. 201610686247.2 filed on Aug. 18, 2016. The disclosures of the aforementioned applications are hereby incorporated by reference in their entireties.

TECHNICAL FIELD

The present disclosure relates to the field of data storage technologies, and in particular, to a flash device access method, apparatus, and system.

BACKGROUND

A flash device is a nonvolatile storage array with a long lifetime, and data stored in the flash device is not lost even in the case of a power outage. Due to its nonvolatile storage feature and high-speed reading/writing performance, the flash device is widely applied in recent years.

In an application, a minimum storage unit of the flash device is a storage unit, and data is stored in an electron form in the storage unit. In addition, different data is represented as different threshold voltages Vth in the storage unit. For example, in a storage array of a single-level storage unit (SLC) type, each storage unit stores one bit of data, and stored data is 0 or 1. As shown in FIG. 1, when the storage unit stores data of 1, probability distribution of Vth is shown in a left pattern in FIG. 1, and when the storage unit stores data of 0, probability distribution of Vth is shown in a right pattern in FIG. 1. In other approaches, a controller of the flash device usually reads data stored in the storage unit in the following manner. A threshold voltage Vth of the storage unit is first obtained, and then a preset decision voltage Vread is compared with the threshold voltage Vth of the storage unit. When the decision voltage Vread is greater than a threshold voltage Vth of a storage unit, the data stored in the storage unit is "1", and when the decision voltage Vread is less than a threshold voltage Vth of the storage unit, the data stored in the storage unit is "0".

However, in an application, electrons in the storage unit leak as time passes and a threshold voltage of the storage unit whose electrons leak is shifted along a low level direction. In this case, in the foregoing method, for the storage unit that stores the data of 0, when the threshold voltage Vth of the storage unit is shifted to a voltage less than a preset decision voltage Vread, incorrect determining of the data stored in the storage unit is caused. For example, referring to FIG. 1 again, data stored in the storage unit is 0, and initial Vth of the storage unit is 5 volts (V). After a period of time, because electrons of the storage unit leak, the threshold voltage Vth of the storage unit is changed to 2 V, a preset decision voltage Vread is 3 V. In this case, if the foregoing method is used, because the decision voltage Vread (3 V) is greater than the threshold voltage Vth (2 V), the controller of the flash device incorrectly determines, as 1, the data stored in the storage unit.

SUMMARY

Embodiments of the present disclosure provide a flash device access method, apparatus, and system, to reduce incorrect determining of data stored in a flash device.

According to a first aspect, the present disclosure provides a flash device access method. A flash device includes a controller and a storage array, the storage array includes a specific storage unit and a user storage unit, the specific storage unit is configured to store specific data, the user storage unit is configured to store user data, the specific data is used to determine a decision voltage for reading the user data, and the method includes reading, by the controller, the specific data stored in the specific storage unit, determining a decision voltage based on the read specific data, and reading, using the determined decision voltage, the user data stored in the user storage unit.

In this embodiment of the present disclosure, the storage array is divided into the specific storage unit and the user storage unit in advance, a storage feature of the specific storage unit is the same as that of the user storage unit, shifts of threshold voltages Vth of the specific storage unit and the user storage unit are the same, and therefore, decision voltages Vread used by the specific storage unit and the user storage unit tend to be the same. In addition, in this embodiment of the present disclosure, each time the controller reads the user data from the user storage unit, the controller reads the specific data stored in the specific storage unit and determines the decision voltage Vread based on the read specific data, and finally, the controller reads the user data stored in the user storage unit using the determined decision voltage Vread. Because the shifts of the threshold voltages Vth of the specific storage unit and the user storage unit tend to be the same, the data stored in the user storage unit is read using the determined decision voltage Vread in the specific storage unit, to reduce incorrect determining that is of the stored data and that is caused by the shift of the threshold voltage Vth.

With reference to the first aspect, in a first possible implementation, reading, by the controller, the specific data stored in the specific storage unit includes obtaining, by the controller, a current threshold voltage of the specific storage unit, and comparing a preset decision voltage with the current threshold voltage of the specific storage unit to determine the specific data stored in the specific storage unit. In this embodiment of the present disclosure, the specific data stored in the specific storage unit may be obtained.

With reference to the first possible implementation of the first aspect, in a second possible implementation, determining, by the controller, a decision voltage based on the read specific data includes calculating, by the controller, a bit error rate of the determined specific data, and using the preset decision voltage as the determined decision voltage when the bit error rate is less than a preset threshold.

In this embodiment of the present disclosure, specific data whose bit error rate is less than a preset threshold may be obtained, and then, the user data is read from the user storage unit using the decision voltage Vread corresponding to the specific data whose bit error rate is less than the preset threshold, such that a bit error rate of the read user data can also be less than the preset threshold, thereby reducing incorrect determining of the stored data.

With reference to the first possible implementation of the first aspect, in a third possible implementation, there are at least two preset decision voltages, and comparing, by the controller, a preset decision voltage with the current threshold voltage of the specific storage unit, to determine the specific data stored in the specific storage unit includes comparing, by the controller, each preset decision voltage with the current threshold voltage of the specific storage unit, to determine the specific data stored in the specific storage unit. Determining, by the controller, a decision voltage based on the read specific data includes calculating, by the controller, a bit error rate of the specific data determined based on each preset decision voltage, and selecting a preset decision voltage corresponding to determined specific data with a minimum bit error rate as the determined decision voltage.

In this embodiment of the present disclosure, the user data is read from the user storage unit using the decision voltage corresponding to the specific data with the minimum bit error rate, such that a bit error rate of the read user data can also be minimum, thereby reducing incorrect determining of the stored data.

With reference to the second possible implementation of the first aspect or the third possible implementation of the first aspect, in a fourth possible implementation, calculating, by the controller, a bit error rate of the determined specific data includes comparing, by the controller, the determined specific data with recorded original specific data to obtain the bit error rate of the determined specific data. In this embodiment of the present disclosure, the bit error rate of the determined specific data may be obtained.

With reference to the first aspect, the first possible implementation of the first aspect, the second possible implementation of the first aspect, the third possible implementation of the first aspect, or the fourth possible implementation of the first aspect, in a fifth possible implementation, the method further includes performing, by the controller, a wear operation on the specific storage unit based on a wear feature of the user storage unit, such that a wear feature of the specific storage unit is the same as that of the user storage unit. In this embodiment of the present disclosure, it can be ensured that the wear feature of the specific storage unit is the same as that of the user storage unit.

With reference to the first aspect, the first possible implementation of the first aspect, the second possible implementation of the first aspect, the third possible implementation of the first aspect, or the fourth possible implementation of the first aspect, in a sixth possible implementation, the method further includes synchronously rewriting, by the controller, the specific data into the specific storage unit when writing the user data into the user storage unit such that a data storage duration feature of the specific storage unit is the same as that of the user storage unit. In this embodiment of the present disclosure, it can be ensured that the data storage duration feature of the specific storage unit is the same as that of the user storage unit.

According to a second aspect, the present disclosure provides a flash device access method. A flash device includes a controller and a storage array, the storage array includes a specific storage unit and a user storage unit, the specific storage unit is configured to store specific data, the user storage unit is configured to store user data, the specific data is used to determine a decision voltage for reading the user data, and the method includes obtaining, by the controller, a current threshold voltage and an original threshold voltage of the specific storage unit, and determining a decision voltage based on the current threshold voltage and the original threshold voltage of the specific storage unit, and reading, using the determined decision voltage, the user data stored in the user storage unit, where the original threshold voltage is a threshold voltage of the specific storage unit when the specific data is written.

It can be learned from the foregoing description that, in this embodiment of the present disclosure, in the foregoing method, the decision voltage Vread may be determined based on a real-time shift status of the threshold voltage Vth of the storage unit, thereby reducing incorrect determining of the data stored in the storage unit.

According to a third aspect, the present disclosure provides a flash device access apparatus. A flash device includes at least a storage array, the storage array includes a specific storage unit and a user storage unit, the specific storage unit is configured to store specific data, the user storage unit is configured to store user data, the specific data is used to determine a decision voltage for reading the user data, and the apparatus includes a reading unit and a determining unit. The reading unit is configured to read the specific data stored in the specific storage unit and read the user data stored in the user storage unit using the determined decision voltage. The determining unit is configured to determine a decision voltage based on the read specific data. Incorrect determining of the data stored in the storage unit may be reduced using the apparatus in the present disclosure.

With reference to the third aspect, in a first possible implementation, when reading the specific data stored in the specific storage unit, the reading unit is further configured to obtain a current threshold voltage of the specific storage unit, and compare a preset decision voltage with the current threshold voltage of the specific storage unit to determine the specific data stored in the specific storage unit. In this embodiment of the present disclosure, the specific data in the storage unit may be determined.

With reference to the first possible implementation of the third aspect, in a second possible implementation, the determining unit is further configured to calculate a bit error rate of the determined specific data, and use the preset decision voltage as the determined decision voltage when the bit error rate is less than a preset threshold.

In this embodiment of the present disclosure, specific data whose bit error rate is less than a preset threshold may be obtained, and then, the user data is read from the user storage unit using the decision voltage Vread corresponding to the specific data whose bit error rate is less than the preset threshold, such that a bit error rate of the read user data can also be less than the preset threshold, thereby reducing incorrect determining of stored data.

With reference to the first possible implementation of the third aspect, in a third possible implementation, there are at least two preset decision voltages, and when reading the specific data stored in the specific storage unit, the reading unit is further configured to compare each preset decision voltage with the current threshold voltage of the specific storage unit to determine the specific data stored in the specific storage unit. The determining unit is further configured to calculate a bit error rate of the specific data determined based on each preset decision voltage, and select a preset decision voltage corresponding to determined specific data with a minimum bit error rate as the determined decision voltage.

In this embodiment of the present disclosure, the user data is read from the user storage unit using the decision voltage corresponding to the specific data with the minimum bit error rate, such that a bit error rate of the read user data can also be minimum, thereby reducing incorrect determining of the stored data.

With reference to the second possible implementation of the third aspect or the third possible implementation of the third aspect, in a fourth possible implementation, when calculating the bit error rate of the determined specific data, the determining unit is further configured to compare the determined specific data with recorded original specific data to obtain the bit error rate of the determined specific data. In this embodiment of the present disclosure, the bit error rate of the determined specific data may be obtained.

With reference to the third aspect, the first possible implementation of the third aspect, the second possible implementation of the third aspect, the third possible implementation of the third aspect, or the fourth possible implementation of the third aspect, in a fifth possible implementation, the apparatus further includes a wear unit configured to perform a wear operation on the specific storage unit based on a wear feature of the user storage unit, such that a wear feature of the specific storage unit is the same as that of the user storage unit. In this embodiment of the present disclosure, it can be ensured that the wear feature of the specific storage unit is the same as that of the user storage unit.

With reference to the third aspect, the first possible implementation of the third aspect, the second possible implementation of the third aspect, the third possible implementation of the third aspect, or the fourth possible implementation of the third aspect, in a sixth possible implementation, the apparatus further includes a rewriting unit configured to synchronously rewrite the specific data into the specific storage unit when the user data is written into the user storage unit such that a data storage duration feature of the specific storage unit is the same as that of the user storage unit. In this embodiment of the present disclosure, it can be ensured that the data storage duration feature of the specific storage unit is the same as that of the user storage unit.

According to a fourth aspect, the present disclosure provides a flash device access apparatus. A flash device includes a storage array, the storage array includes a specific storage unit and a user storage unit, the specific storage unit is configured to store specific data, the user storage unit is configured to store user data, the specific data is used to determine a decision voltage for reading the user data, and the apparatus includes an obtaining unit, a decision voltage determining unit, and a user data reading unit, where the obtaining unit is configured to obtain a current threshold voltage and an original threshold voltage of the specific storage unit, where the original threshold voltage is a threshold voltage of the specific storage unit when the specific data is written, the decision voltage determining unit is configured to determine a decision voltage based on the current threshold voltage and the original threshold voltage of the specific storage unit, and the user data reading unit is configured to read, using the determined decision voltage, the user data stored in the user storage unit.

It can be learned from the foregoing description that, in this embodiment of the present disclosure, in the foregoing method, the decision voltage Vread may be determined based on a real-time shift status of the threshold voltage Vth of the storage unit, thereby reducing incorrect determining of the data stored in the storage unit.

According to a fifth aspect, the present disclosure provides a flash device access system. The system includes the flash device access apparatus and the storage array according to the third aspect. The storage array includes a specific storage unit and a user storage unit, the specific storage unit is configured to store specific data, the user storage unit is configured to store user data, and the specific data is used to determine a decision voltage for reading the user data. The flash device access apparatus is further configured to read the specific data stored in the specific storage unit, determine a decision voltage based on the read specific data, and read, using the determined decision voltage, the user data stored in the user storage unit.

Alternatively, the system includes the flash device access apparatus and the storage array according to the fourth aspect. The storage array includes a specific storage unit and a user storage unit, the specific storage unit is configured to store specific data, the user storage unit is configured to store user data, the specific data is used to determine a decision voltage for reading the user data, and the flash device access apparatus is further configured to obtain a current threshold voltage and an original threshold voltage of the specific storage unit, where the original threshold voltage is a threshold voltage of the specific storage unit when the specific data is written, determine a decision voltage based on the current threshold voltage and the original threshold voltage of the specific storage unit, and read, using the determined decision voltage, the user data stored in the user storage unit. Incorrect determining of the stored data may be reduced using the system in the present disclosure.

According to a sixth aspect, the present disclosure provides a readable medium. The readable medium includes an execution instruction, and when a processor of a storage controller executes the execution instruction, a storage controller performs the method according to the first aspect or the method according to the second aspect. Incorrect determining of the stored data may be reduced using the readable medium in the present disclosure.

According to a seventh aspect, a storage controller is provided. The storage controller includes a processor, a memory, and a bus. The memory is configured to store an execution instruction, the processor and the memory are connected using the bus, and when the storage controller runs, the processor executes the execution instruction stored in the memory, such that the storage controller performs the method according to the first aspect or the method according to the second aspect. Incorrect determining of the stored data may be reduced using the storage controller in the present disclosure.

It can be learned from the foregoing description that, in this embodiment of the present disclosure, the storage array is divided into the specific storage unit and the user storage unit in advance, the storage feature of the specific storage unit is the same as that of the user storage unit, shifts of the threshold voltages Vth of the specific storage unit and the user storage unit are the same, and therefore, decision voltages Vread used by the specific storage unit and the user storage unit tend to be the same. In addition, in this embodiment of the present disclosure, each time the controller reads the user data from the user storage unit, the controller reads the specific data stored in the specific storage unit and determines the decision voltage Vread based on the read specific data, and finally, the controller reads the user data stored in the user storage unit using the determined decision voltage Vread. Because the shifts of the threshold voltages Vth of the specific storage unit and the user storage unit tend to be the same, the data stored in the user storage unit is read using the determined decision voltage Vread in the specific storage unit, to reduce incorrect determining that is of the data stored in the flash device and that is caused by the shift of the threshold voltage Vth.

BRIEF DESCRIPTION OF DRAWINGS

To describe the technical solutions in some of the embodiments of the present disclosure, accompanying drawings in the following description show some embodiments of the present disclosure, and persons of ordinary skill in the art may derive other drawings from these accompanying drawings.

DESCRIPTION OF EMBODIMENTS

The following clearly describes the technical solutions in the embodiments of the present disclosure with reference to the accompanying drawings in the embodiments of the present disclosure. The described embodiments are merely some but not all of the embodiments of the present disclosure.

The present disclosure first provides a flash device access method, and an application scenario of the method is as follows.

Currently, the flash device mainly includes two parts, a controller and a storage array. A minimum storage unit of the storage array is a storage unit. Data stored in the storage unit is usually read using the following method. A threshold voltage Vth of the storage unit is first obtained, and then a preset decision voltage Vread is compared with the threshold voltage Vth of the storage unit. A single-level storage unit is used as an example for description. The SLC refers to a storage unit recording only one binary bit "0" or "1". If the decision voltage Vread is greater than a threshold voltage Vth of the storage unit, the data stored in the storage unit is "1", or if the decision voltage Vread is less than the threshold voltage Vth of the storage unit, the data stored in the storage unit is "0".

Because the data exists in an electron form in the storage unit and electrons in the storage unit leak as time passes in actual application, the threshold voltage Vth is shifted along the low level direction. However, in the other approaches, the stored data is read from the storage array using the preset decision voltage Vread, and this causes incorrect determining of the data stored in the storage unit. For example, the data stored in the storage unit is "0", the initial threshold voltage Vth of the storage unit is 5 V, and after a period of time, because electrons in the storage unit leak, a threshold voltage Vth of the storage unit is changed to 2 V, a preset decision voltage Vread is 3 V, and in this case, if the foregoing method is used, because the decision voltage Vread (3 V) is greater than the threshold voltage Vth (2 V), the data stored in the storage unit is incorrectly determined as "1".

It should be understood that, for ease of description, in this embodiment of the present disclosure, only the single-level storage unit is used as an example for description. However, this embodiment of the present disclosure is applicable to a multiple-level storage unit (MLC), and the MLC refers to a storage unit that can record two or more binary bits.

Embodiment 1

Figure 2:
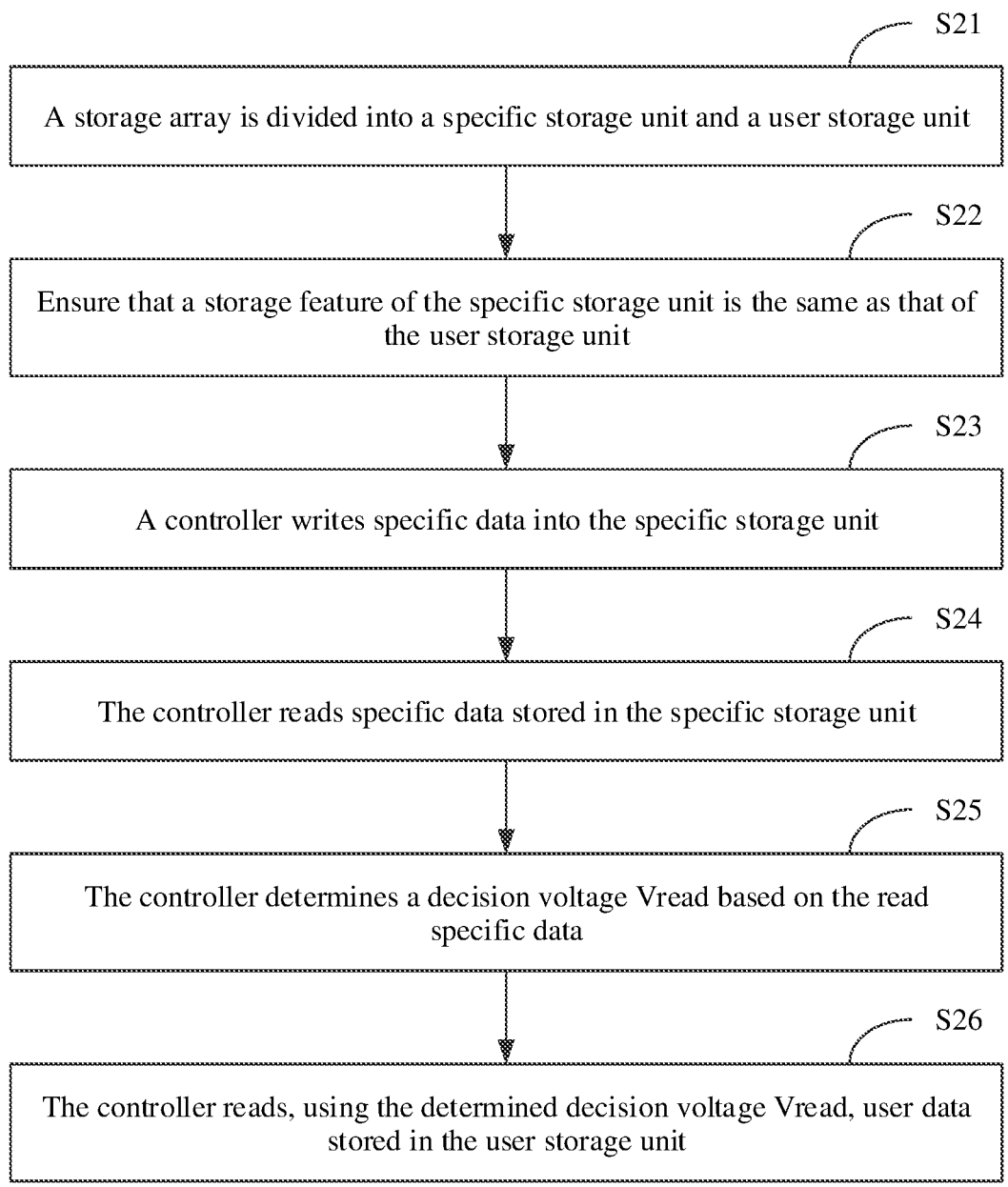
FIG. 2 is a schematic flowchart of a flash device access method according to an embodiment of the present disclosure.

Based on the foregoing application scenario, the present disclosure provides a flash device access method, and a flash device may be a device such as a universal serial bus (USB) flash drive and an SSD. The flash device may include a controller and a storage array. A function of the controller may be implemented by a control chip. A function of the storage array may be implemented by a storage chip. The storage chip is a flash chip, and a chip of the flash type may be a NAND flash chip. In addition, as shown in FIG. 2, the flash device access method provided in the present disclosure may include the following steps.

Step S21. The storage array is first divided into a specific storage unit and a user storage unit.

The specific storage unit is configured to store specific data, the user storage unit is configured to store user data, and the specific data is used to determine a decision voltage Vread for reading the user data. In this embodiment of the present disclosure, the specific data may be N-bit binary data, and the specific data is data that is known by a computer system in advance. For example, the specific data may be a preset binary sequence, or the computer system backs up the specific data into a storage device with relatively high security performance. N is a positive integer greater than 0. Details are not described in the following embodiment again.

Figure 3:
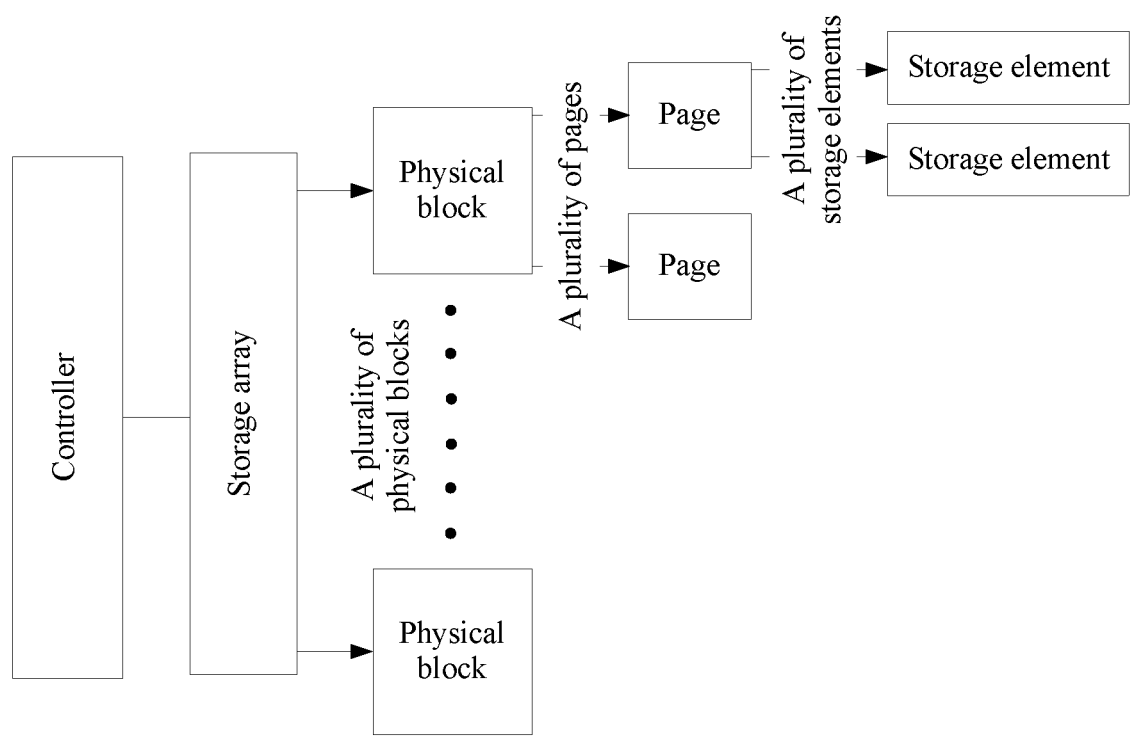
FIG. 3 is a schematic structural diagram of a solid state drive (SSD) according to an embodiment of the present disclosure.

In this embodiment of the present disclosure, as shown in FIG. 3, the storage array of the flash device may include a plurality of physical blocks, and each physical block may include a plurality of pages, and each page includes a plurality of storage units. In actual application, the SSD erases the stored data per physical block, and the SSD reads and writes the stored data on a per-page basis. To facilitate an erasure operation on the specific data stored in the specific storage unit, some physical blocks may be reserved in the storage array. The storage unit in the physical block is used to store the specific data, and i.e., the foregoing specific storage unit may include one or more storage units in the reserved physical blocks. In addition, a remaining physical block of the storage array is used to store the user data, and i.e., the foregoing user storage unit may include one or more storage units in the remaining physical block. In this embodiment of the present disclosure, 0.5% of physical blocks in the storage array may be set to store the specific data, and 99.5% of the physical blocks may be set to store the user data.

Step S22. Ensure that a storage feature of the specific storage unit is the same as that of the user storage unit.

In this embodiment of the present disclosure, because a main factor that determines a shift of the threshold voltage Vth of the storage unit is a wear feature, namely, Program/Erase cycle (PE), and a data storage duration (retention) feature of the storage unit, in this embodiment of the present disclosure to ensure that wear features of the specific storage unit and the user storage unit are the same and data storage duration features of the specific storage unit and the user storage unit are the same, the following manner may be used.

It should be understood that, because the flash device performs an erasure operation per physical block and quantities of PE times of different physical blocks may be different, a physical block that stores the user data may be divided into a plurality of user storage units. Each user storage unit is respectively corresponding to one specific storage unit, and i.e., there may be separately a plurality of user storage units and a plurality of specific storage units, and there is a correspondence between the user storage unit and the specific storage unit. The user storage unit and the specific storage unit corresponding to each other have a same storage feature. In addition, the correspondence between the user storage unit and the specific storage unit may be dynamically adjusted. For ease of description, unless otherwise stated, the user storage unit and the specific storage unit correspond to each other in the following description.

The controller performs a wear operation on the specific storage unit based on a wear feature of the user storage unit, such that a wear feature of the specific storage unit is the same as that of the user storage unit. Wear operations include an erasure operation on the specific data stored in the specific storage unit and an operation of rewriting the specific data into the specific storage unit.

Optionally, the controller may obtain, for once, a quantity of erasure/writing times of the user storage unit at intervals of each preset duration. The quantity of erasure/writing times may be a quantity of times of erasing the stored data from the user storage unit. The user storage unit may record the quantity of erasure/writing times of the user storage unit. Further, each time data is erased from the user storage unit, a count may be increased by 1, and after the controller obtains the quantity of erasure/writing times, the controller performs erasure/writing operations on the specific storage unit for the same times. For example, the quantity of erasure/writing times that is obtained by the controller is M, and the controller may perform, for M times, erasure operations on the specific data stored in the specific storage unit, and then write the specific data into the specific storage unit. M is a positive integer greater than 0.

Optionally, the controller may further perform, for once, an erasure and writing operation on the specific storage unit each time it is detected that an erasure and writing operation is performed on the user storage unit. Further, each time it is detected that the data stored in the user storage unit is erased and new data is written, the controller may erase the specific data stored in the specific storage unit, and then rewrite the specific data into the specific storage unit.

When writing the user data into the user storage unit, the controller synchronously rewrites the specific data into the specific storage unit, such that a data storage duration feature of the specific storage unit is the same as that of the user storage unit.

Optionally, because the storage unit of the flash device cannot perform a rewriting operation before the erasure operation is performed, the controller may allocate a plurality of specific storage units to each user storage unit in advance, and rewrite the specific data into a new specific storage unit each time the user data is written into the user storage unit. For example, three specific storage units are allocated to one user storage unit. The three specific storage units are respectively a first storage unit, a second storage unit, and a third storage unit. Further, the specific data may be written into a first specific storage unit when the flash device is delivered from the factory, and when data is written into the user storage unit, the specific data written into the first specific storage unit is read, and then the specific data is synchronously written into a second specific storage unit, such that a data storage duration feature of the second specific storage unit is the same as the data storage duration feature of the user storage unit.

Optionally, the controller may further charge the specific storage unit each time the user data is written into the user storage unit to compensate for electron leakage that is of the specific storage unit and that is caused by different storage duration, such that initial threshold voltages Vth of the specific storage unit and the user storage unit are the same.

Step S23. The controller writes specific data into the specific storage unit.

Step S24. The controller reads the specific data stored in the specific storage unit each time the controller reads user data from the user storage unit.

Step S25. The controller determines a decision voltage Vread based on the read specific data.

Step S26. The controller reads, using the determined decision voltage Vread, the user data stored in the user storage unit.

It can be learned from the foregoing description that, in this embodiment of the present disclosure, the storage array is divided into the specific storage unit and the user storage unit in advance, the storage feature of the specific storage unit is the same as that of the user storage unit, shifts of the threshold voltages Vth of the specific storage unit and the user storage unit are the same, and therefore, decision voltages Vread used by the specific storage unit and the user storage unit tend to be the same. In addition, in this embodiment of the present disclosure, each time the controller reads the user data from the user storage unit, the controller reads the specific data stored in the specific storage unit and determines the decision voltage Vread based on the read specific data, and finally, the controller reads the user data stored in the user storage unit using the determined decision voltage Vread. Because the shifts of the threshold voltages Vth of the specific storage unit and the user storage unit tend to be the same, the data stored in the user storage unit is read using the determined decision voltage Vread in the specific storage unit, to reduce incorrect determining that is of the stored data and that is caused by the shift of the threshold voltage Vth.

Embodiment 2

In this embodiment of the present disclosure, step S24 "the controller reads the specific data stored in the specific storage unit" in Embodiment 1 may be as follows. The controller obtains a current threshold voltage Vth of the specific storage unit, and the controller compares a preset decision voltage Vread with the current threshold voltage Vth of the specific storage unit, to determine the specific data stored in the specific storage unit. In this embodiment of the present disclosure, the specific storage unit may include a plurality of storage units, and obtained threshold voltages Vth may be obtained threshold voltages Vth of the plurality of storage units. As mentioned above, for a flash device of an SLC type, when the preset decision voltage Vread is greater than a current threshold voltage Vth of the storage unit in the specific storage unit, data stored in the storage unit of the specific storage unit may be determined as "1", or when the preset decision voltage Vread is less than a current threshold voltage Vth of the storage unit in the specific storage unit, data stored in the storage unit of the specific storage unit is determined as "0".

Correspondingly, step S25 "the controller determines a decision voltage Vread based on the read specific data" in Embodiment 1 may include that the controller calculates a bit error rate of determined specific data in the specific storage unit, and if the bit error rate of the determined specific data is less than a preset threshold, the preset decision voltage Vread is used as the determined decision voltage Vread, or if the bit error rate of the determined specific data is greater than or equal to a preset threshold, the controller adjusts the preset decision voltage Vread, redetermines the specific data in the specific storage unit using an decision voltage Vread, and calculates a bit error rate of the redetermined specific data. The process is repeatedly performed until the bit error rate of the determined specific data is less than the preset threshold.

Figure 6:
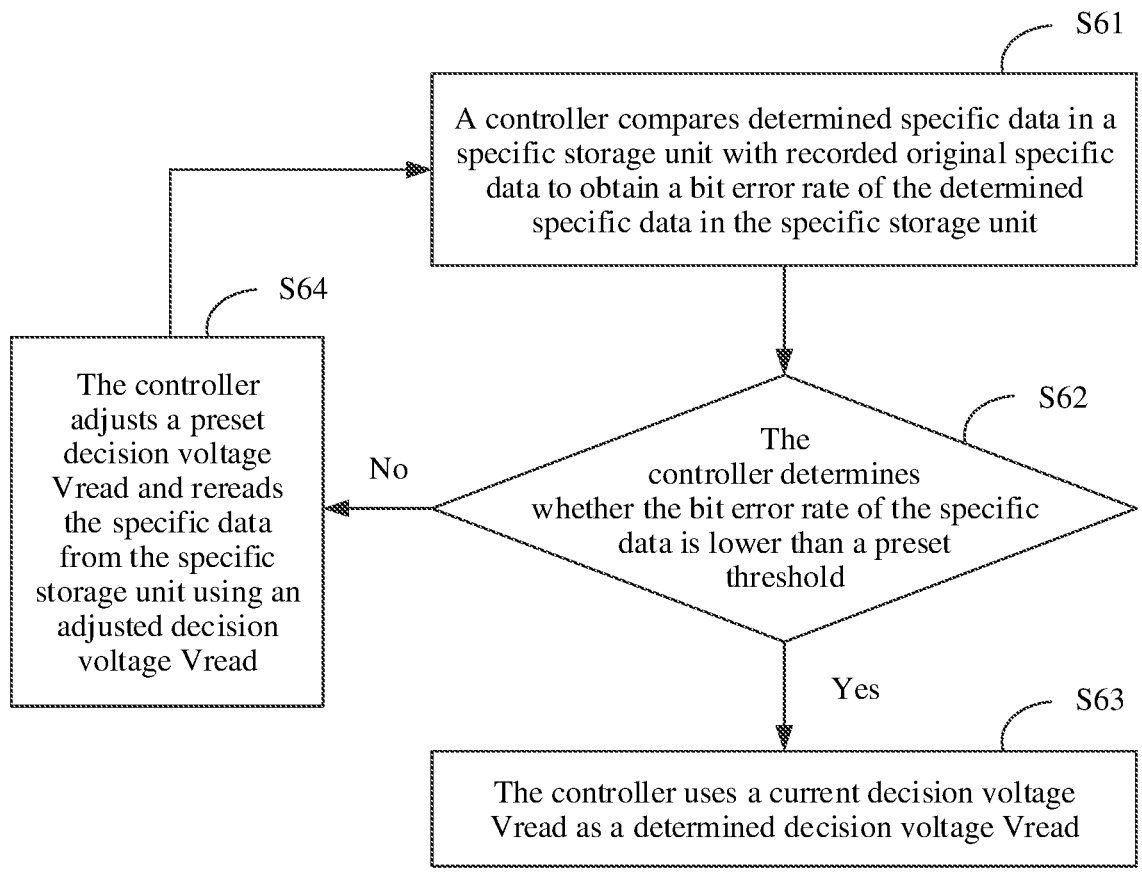
FIG. 6 is another schematic flowchart of a flash device access method according to an embodiment of the present disclosure.

Further, as shown in FIG. 6, a process of determining the decision voltage may include the following steps.

Step S61. The controller compares the determined specific data in the specific storage unit with recorded original specific data, to obtain a bit error rate of the determined specific data in the specific storage unit.

Optionally, the controller can record the original specific data in the preset storage medium in the following specific manner When writing the specific data into the specific storage unit, the controller can synchronously write the specific data into the preset storage medium, and data storage reliability of the preset storage medium is higher than data storage reliability of the specific storage unit. In this embodiment of the present disclosure, the preset storage medium may be located inside or outside the flash device. When the preset storage medium is located inside the flash device, the controller of the flash device has a storage medium configured to store a program instruction, and reliability of the storage medium is higher than data storage reliability of the storage unit. Therefore, the specific data may be stored in the storage medium on the controller of the flash device. The storage medium may be a storage chip of a NOR flash type. In addition, reliability of the storage chip of the NOR flash type is higher than a chip that is of a NAND flash type and that is usually used by the storage array of the flash device. In this embodiment of the present disclosure, the controller may obtain the original specific data from the preset storage medium.

Optionally, the controller can further record the original specific data in the program instruction in a specific manner. The original specific data may be directly recorded in the program instruction in advance. Therefore, the controller further directly obtains the original specific data from the program instruction.

For example, it is assumed that the recorded original specific data is 00000, and after a period of time, because the threshold voltage Vth of the specific storage unit is shifted, the controller incorrectly determines, as 00011 using the preset decision voltage Vread, the data stored in the specific storage unit, and i.e., the specific data read by the controller from the specific storage unit is 00011, in this case, the controller can compare the two pieces of specific data 00011 and 00000, and can determine that two bits in one piece of specific data are different from two bits in the other piece of specific data, the specific data has five bits in total, and therefore, a bit error rate of the specific data read from the specific storage unit may be determined as $2/5=40\%$.

Step S62. The controller determines whether the bit error rate of the specific data is less than a preset threshold, and if the bit error rate of the specific data is less than the preset threshold, step S63 is performed, or if the bit error rate of the specific data is not less than the preset threshold, step S64 is performed.

Further, the user can autonomously set a size of a preset threshold.

Step S63. The controller uses a current decision voltage Vread as a determined decision voltage Vread.

Step S64. The controller adjusts a preset decision voltage Vread, and rereads specific data from the specific storage unit using an adjusted decision voltage Vread, and then a process returns to step S61, and is performed until specific data whose bit error rate is less than a preset threshold is obtained.

For a method for reading the specific data using the decision voltage Vread, refer to the foregoing manner of reading the specific data using the preset decision voltage Vread.

It can be learned from the foregoing description that, in this embodiment of the present disclosure, specific data whose bit error rate is less than a preset threshold may be obtained, and then, the user data is read from the user storage unit using the decision voltage Vread corresponding to the specific data whose bit error rate is less than the preset threshold, such that a bit error rate of the read user data can also be less than the preset threshold, thereby reducing incorrect determining of the stored data.

Optionally, there are at least two preset decision voltages, and that the controller compares the preset decision voltage with the current threshold voltage of the specific storage unit, to determine the specific data stored in the specific storage unit may be comparing, by the controller, each preset decision voltage with the current threshold voltage of the specific storage unit to determine the specific data stored in the specific storage unit. Step S25 "the controller determines a decision voltage Vread based on the read specific data" in Embodiment 1 may be calculating, by the controller, a bit error rate of the specific data determined based on each preset decision voltage Vread, and selecting, by the controller, a preset decision voltage Vread corresponding to determined specific data with a minimum bit error rate as the determined decision voltage Vread.

Figure 7:
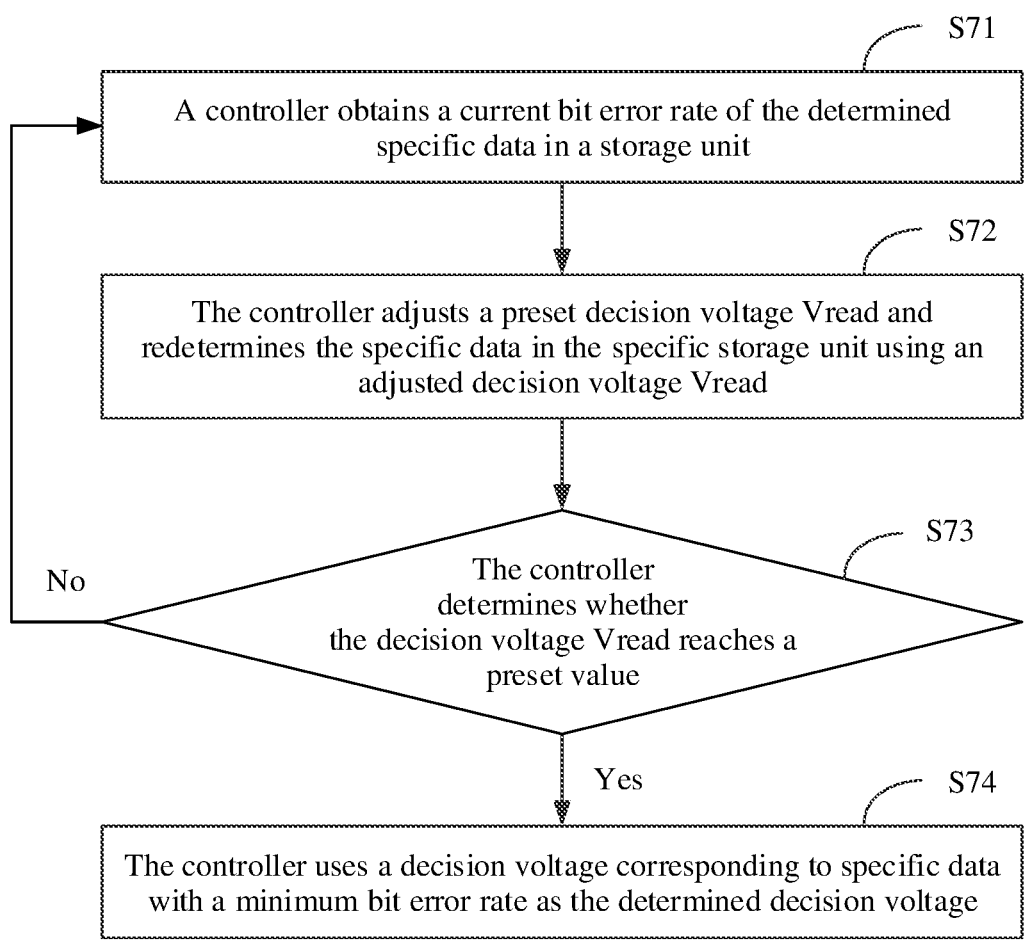
FIG. 7 is still another schematic flowchart of a flash device access method according to an embodiment of the present disclosure.

Further, as shown in FIG. 7, a process of determining the decision voltage may include the following steps.

Step S71. A controller obtains a current bit error rate of the determined specific data in a storage unit.

For details about how to calculate the bit error rate of the specific data, refer to the foregoing description.

Step S72. The controller adjusts a preset decision voltage Vread and redetermines the specific data in the specific storage unit using an adjusted decision voltage Vread.

Because electron leakage of the storage unit only causes a threshold voltage Vth of the storage unit to be shifted along the low level direction, only the decision voltage Vread needs to be adjusted along a low level direction. For example, a decision voltage Vread of the storage array may be adjusted by one step along the low level direction each time, and the step may be 10 millivolts (mV). For another example, an original preset decision voltage Vread of the flash device is 50 mV, after being adjusted for once, the decision voltage Vread may be changed to 40 mV, and the controller further rereads the specific data from the specific storage unit using the decision voltage Vread of 40 mV. Likewise, for a flash device of an SLC type, the decision voltage Vread of 40 mV may be further compared with the threshold voltage Vth of the specific storage unit, and when the decision voltage Vread is greater than the current threshold voltage Vth, the data stored in the specific storage unit is "1", otherwise, the data stored in the specific storage unit is "0".

Step S73. The controller determines whether the decision voltage Vread reaches a preset value, and if the decision voltage Vread reaches the preset value, step S74 is performed, or if the decision voltage Vread does not reach the preset value, a process returns to step S71.

Further, the controller can determine whether a total adjustment step of the decision voltage Vread reaches a preset value, and the preset value may range from 500 mV to 600 mV (including 500 mV and 600 mV). It is assumed that the decision voltage Vread is adjusted by one step each time, one step is 10 mV, and in the foregoing method, the decision voltage Vread may be adjusted for only 50 to 60 times (including 50 and 60 times).

In this embodiment of the present disclosure, the foregoing example is still used, and when the decision voltage Vread does not reach the preset value, the controller continues to read the specific data from the specific storage unit using an decision voltage Vread. It is assumed that the read specific data is 00001, and a bit error rate of the reread specific data is calculated, the last read specific data of 00001 is compared with the recorded original specific data of 00000, and one bit in one piece of specific data is different from one bit in the other piece of specific data. Therefore, it can be determined that a bit error rate of the last read specific data is equal to ⅕, namely, 20%.

Step S74. The controller uses a decision voltage corresponding to specific data with a minimum bit error rate as the determined decision voltage.

It can be learned from the foregoing description that, the controller can obtain, by adjusting the decision voltage Vread, the specific data that is read using different decision voltages Vread, and can further obtain bit error rates of different specific data. In this embodiment of the present disclosure, specific data with a minimum bit error rate may be selected from the specific data, and the decision voltage Vread corresponding to the specific data with the minimum bit error rate is obtained. Finally, the user data is read from the user storage unit using the decision voltage Vread corresponding to the specific data with the minimum bit error rate.

In this embodiment of the present disclosure, the user data is read from the user storage unit using the decision voltage Vread corresponding to the specific data with the minimum bit error rate, such that a bit error rate of the read user data can also be minimum, thereby reducing incorrect determining of the stored data.

Embodiment 3

The present disclosure further provides another flash device access method. The method may be further applied to an SSD, and the method is as follows.

First, one Block Info Table (BIT) is allocated to each physical block in an SSD storage array in advance. The table may record information such as a quantity of PE times, storage duration (retention), and a quantity of reading times of each physical block. Then, a calibration table is set. The table stores a shift value of the decision voltage Vread of the SSD storage array using the PE, the retention, the quantity of reading times, and an ambient temperature as indexes. The BIT and the calibration table may be stored in a storage medium of an SSD controller.

In this embodiment of the present disclosure, in order that the SSD has a specific error correction capability, error checking and correction (ECC) encoding is usually performed on data that is to be written into the SSD. Therefore, after obtaining the data read from the storage array, the controller further needs to perform ECC decoding on the data.

Figure 8:
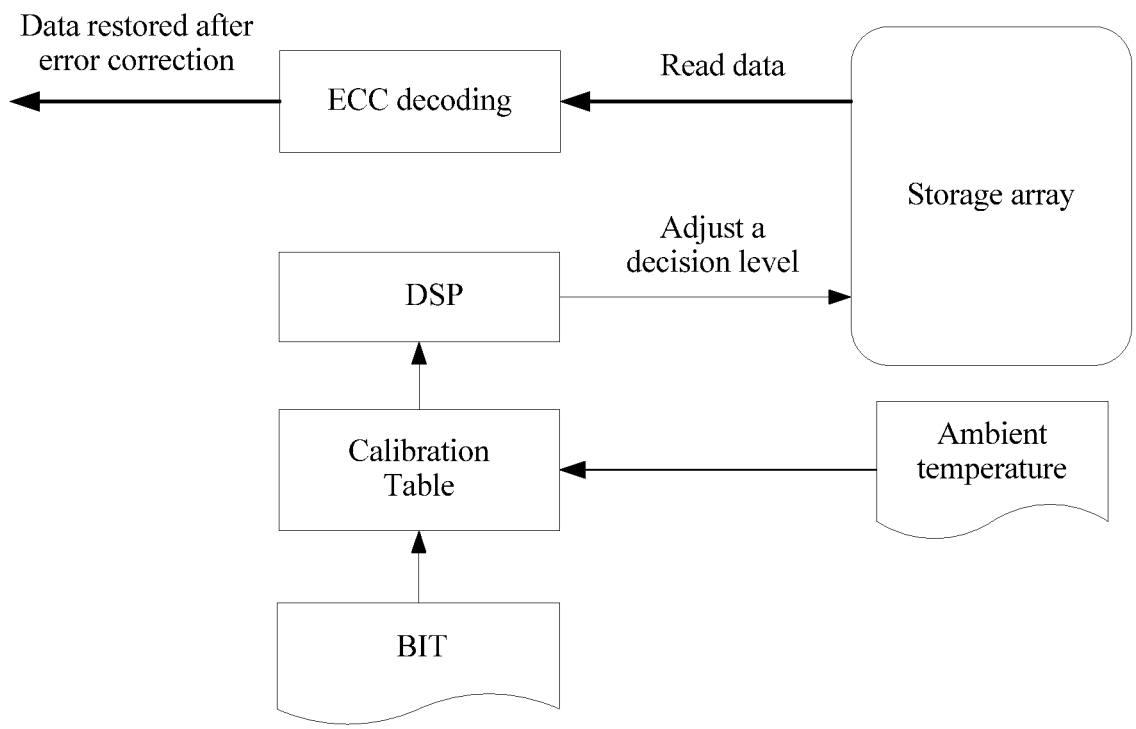
FIG. 8 is yet another schematic flowchart of a flash device access method according to an embodiment of the present disclosure.

Further, in this embodiment of the present disclosure, a function of the SSD controller may be implemented by a Digital Signal Processing (DSP) unit and an ECC decoding unit. When the controller needs to read data of the storage array, the DSP unit in the SSD controller can first obtain ambient temperature information, and a temperature sensor is disposed in the SSD to collect a temperature of an ambience in which the SSD is located. Then, a physical block of the data that needs to be read is determined, a BIT of a current physical block is determined, and information such as PE, retention, and a quantity of reading times of the physical block is obtained from the BIT. Finally, the calibration table is searched for a shift amount of the decision voltage of the storage array based on the obtained information such as an ambient temperature, the PE, the retention, and the quantity of reading times. Then, the controller adjusts the decision voltage of the storage array using a command such as Read Retry/Read Offset. The data inside the storage unit in the storage array is read using the decision voltage. Finally, the ECC decoding unit of the SSD controller performs ECC decoding on the read data, to perform error correction on the read data. For an entire procedure, refer to FIG. 8.

In the foregoing method, after the SSD is powered off, both a temperature sensor and a controller inside the SSD are in a power-off state, neither of the components can run, and the corresponding SSD controller cannot record power-off duration or a temperature change status. Therefore, after the SSD is powered on again, information such as temperature information and storage duration (retention) during power-off cannot be obtained. Because the two types of key parameter information cannot be learned, a shift value of the decision voltage obtained by searching the calibration table is inaccurate, and finally a bit error rate of the data read using the shift value is relatively high. In actual application, an applicant finds that if the SSD is powered on again after being powered off for a long time, the read data overwhelms an error correction capability of the ECC, and as a result, the stored data cannot be accurately obtained.

Embodiment 4

Figure 9:
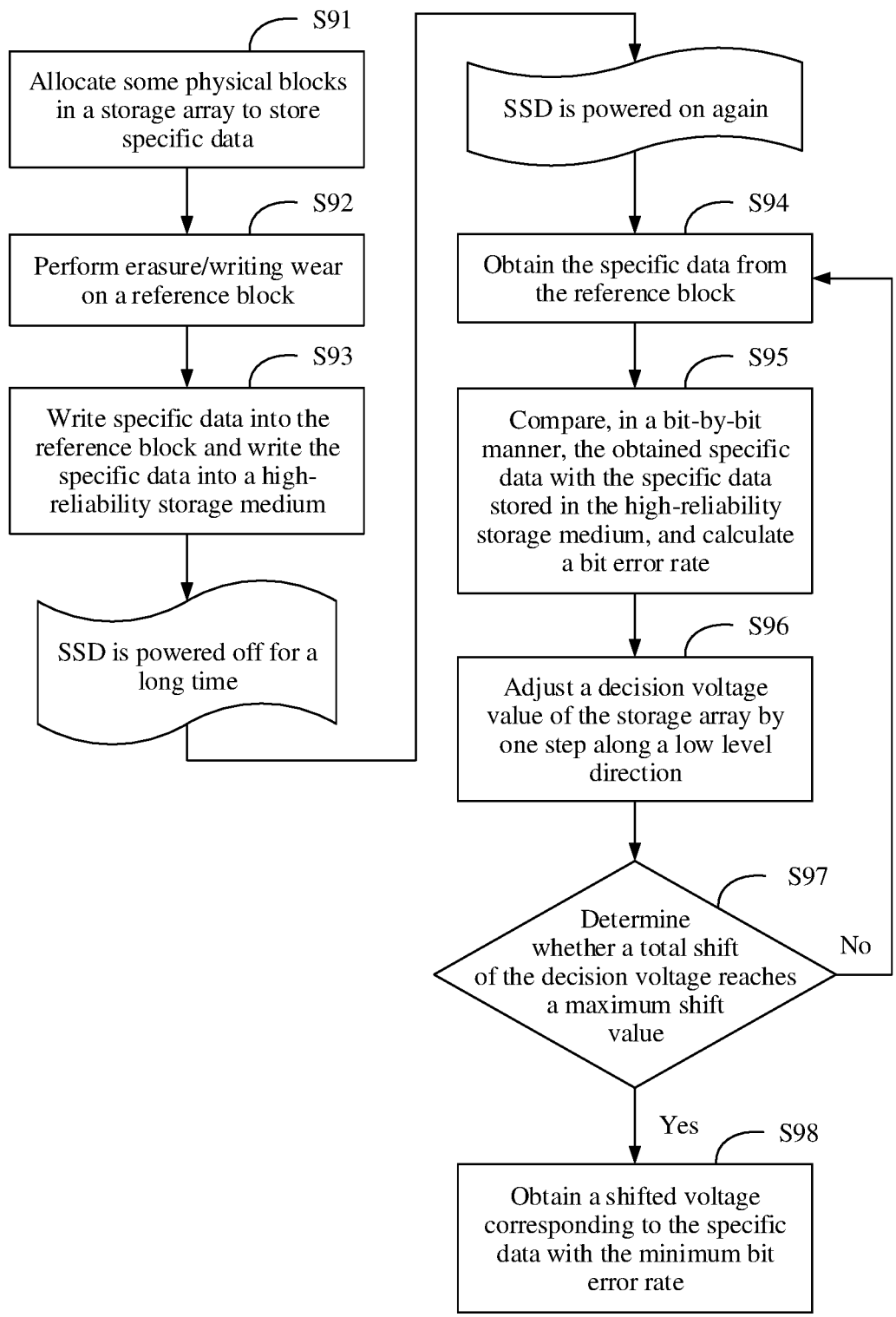
FIG. 9 is still yet another schematic flowchart of a flash device access method according to an embodiment of the present disclosure.

The present disclosure provides another flash device access method. Similarly, the method may be applied to a case in which an SSD solid state drive is powered on again after being powered off for a long time. As shown in FIG. 9, the method is as follows.

Step S91. First allocate some physical blocks in a storage array to store specific data, where the physical blocks are not used to store user data, and a remaining physical block of the storage array is still used to store the user data.

Further, in order to help distinguish physical blocks with different functions, a physical block used for storing specific data may be referred to as a reference block, a physical block used for storing user data may be referred to as a data block, and a storage array of the SSD may include a plurality of flash chips. 0.5% of physical blocks in each flash chip may be allocated to serve as reference blocks, and the remaining 99.5% of physical blocks are used as data blocks.

Step S92. The SSD controller performs erasure/writing wear on a reference block to keep a quantity of erasure/writing times of the reference block same as a quantity of erasure/writing times of the data block.

In actual application, when data is written, the SSD performs overall wear leveling. That is, in the present disclosure, it is assumed that the SSD includes three data blocks the first data block, the second data block, and the third data block. When writing the data, the SSD controller sequentially writes data into the first data block, the second data block, and the third data block. And when erasing the data, the SSD controller also sequentially erases the stored data from the first data block, the second data block, and the third data block, such that quantities of erasure/writing times of data blocks tend to be the same. For details about how to perform erasure/writing wear on the reference block, refer to the description in Embodiment 1. Details are not described herein again.

Step S93. The SSD controller writes specific data into the reference block and writes the specific data into a high-reliability storage medium, where the high-reliability storage medium may be a storage medium in an NOR flash chip.

When the specific data is to be written into the reference block, scrambling needs to be performed, and no ECC encoding needs to be performed. However, scrambling and ECC encoding need to be simultaneously performed on the user data that is to be actually written into the SSD. Scrambling manners of the specific data and the user data are the same. In the present disclosure, an exclusive OR operation may be performed on a white noise random sequence and either the original specific data or the original user data, to obtain scrambled specific data or scrambled user data. In the other approaches, the white noise random sequence may be generated by a linear feedback shift register (LFSR), and a page number is used as an initial value of the LFSR. For details about ECC encoding performed on the user data, refer to the description in Embodiment 4. Details are not described herein again.

It should be noted that, performing scrambling on the specific data and the user data is mainly intended to reduce an Inter-Cell Interference (ICI) effect of the flash chip. The ICI effect refers to a phenomenon of mutual data storage interference between different storage units in the flash chip. Corresponding to a process of performing data scrambling, a process in which scrambling and descrambling further need to be performed on data after scrambled specific data or scrambled user data is read from the storage array may be as follows. The exclusive OR operation is performed on the white noise random sequence and either the scrambled specific data or the scrambled user data again to obtain original specific data or original user data.

If the SSD is powered on again after being powered off for a long time, the following steps are performed.

Step S94. The SSD controller obtains specific data from the reference block.

Step S95. The SSD controller compares, in a bit-by-bit manner, the obtained specific data with the specific data stored in the high-reliability storage medium, and calculates a bit error rate.

Step S96. The SSD controller adjusts, using an interface command of the storage array, a decision voltage value of the storage array by one step along a low level direction, where one step may be 10 mV. The interface command may be used to adjust the decision voltage of the storage array.

A threshold level of the storage unit in the SSD is shifted only along the low level direction when the SSD is powered off, and therefore, only the decision voltage of the storage array needs to be adjusted along the low level direction.

Step S97. The SSD controller determines whether a total shift of the decision voltage reaches a maximum shift value, and if the total shift of the decision voltage does not reach the maximum shift value, a process returns to step S94, otherwise, step S98 is performed, where the maximum shift value may range from 500 mV to 900 mV (including 500 mV and 900 mV).

To be specific, the SSD controller continues to read a shift value of the decision voltage based on a step adjustment, and repeatedly performs step S94 to step S96 to collect statistics on the bit error rate of the specific data for each decision voltage shift value until a maximum shift value of the decision voltage is obtained.

Step S98. Obtain a shifted voltage corresponding to the specific data with the minimum bit error rate.

In addition, after determining the shifted voltage, in this case, the SSD controller can perform reading/writing in response to a computer. After the SSD is powered on, for reading of the stored data, the decision voltage is adjusted using the shifted voltage. In addition, for reading of written data after the SSD is powered on, because retention duration of the stored data may be obtained in this case, a shifted level may be queried using the method disclosed in Embodiment 4, and then data is read using the decision voltage that is adjusted based on the shifted level.

It should be noted that, although the factors such as the PE, the retention duration, the quantity of reading times, and the ambient temperature that affect the shift of the threshold voltage Vth of the storage unit are disclosed in Embodiment 4, two key factors determining the shift of the threshold voltage Vth are the quantity of PE times and the retention duration. In the present disclosure, it can be ensured that a quantity of PE times of the reference block is the same as a quantity of PE times of the data block by wearing the reference block. In addition, after the SSD is powered off for a long time, compared with the long power-off duration, a difference between retention duration of the specific data of the reference block and retention duration of the user data of the data block may be nearly ignored, and therefore, in this embodiment of the present disclosure, the reference block is worn, and i.e., it may be ensured that a shift of the threshold voltage Vth of the reference block is the same as a shift of the threshold voltage Vth of the data block. Certainly, in this embodiment of the present disclosure, when the SSD is powered on, the decision voltage of the storage array may be adjusted using the method provided in Embodiment 4. In the method in this embodiment of the present disclosure, a problem that stored data cannot be restored because of an excessively high bit error rate of the storage unit after the SSD is powered off for a long time can be resolved.

Embodiment 5

The present disclosure further provides another flash device access method. The flash device includes a controller and a storage array, the storage array includes a specific storage unit and a user storage unit, the specific storage unit is configured to store specific data, the user storage unit is configured to store user data, the specific data is used to determine a decision voltage Vread for reading the user data, and the method further includes the following operations.

The controller obtains a current threshold voltage Vth and an original threshold voltage Vth of the specific storage unit, and the original threshold voltage Vth is a threshold voltage Vth of the specific storage unit when the specific data is written.

The controller determines a decision voltage Vread based on the current threshold voltage Vth and the original threshold voltage Vth of the specific storage unit.

Figure 1:
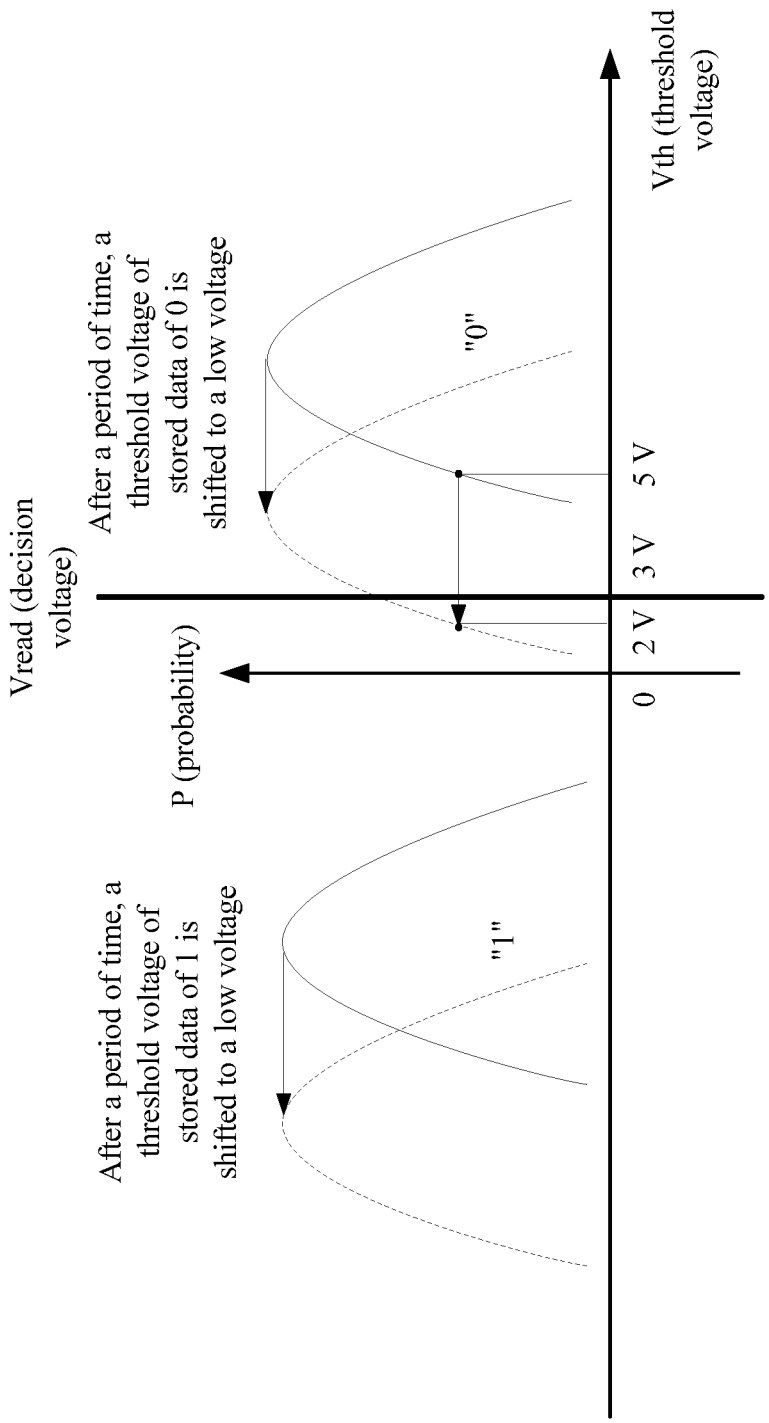
FIG. 1 is a schematic diagram of probability distribution of a threshold voltage of a flash device.
Figure 4:
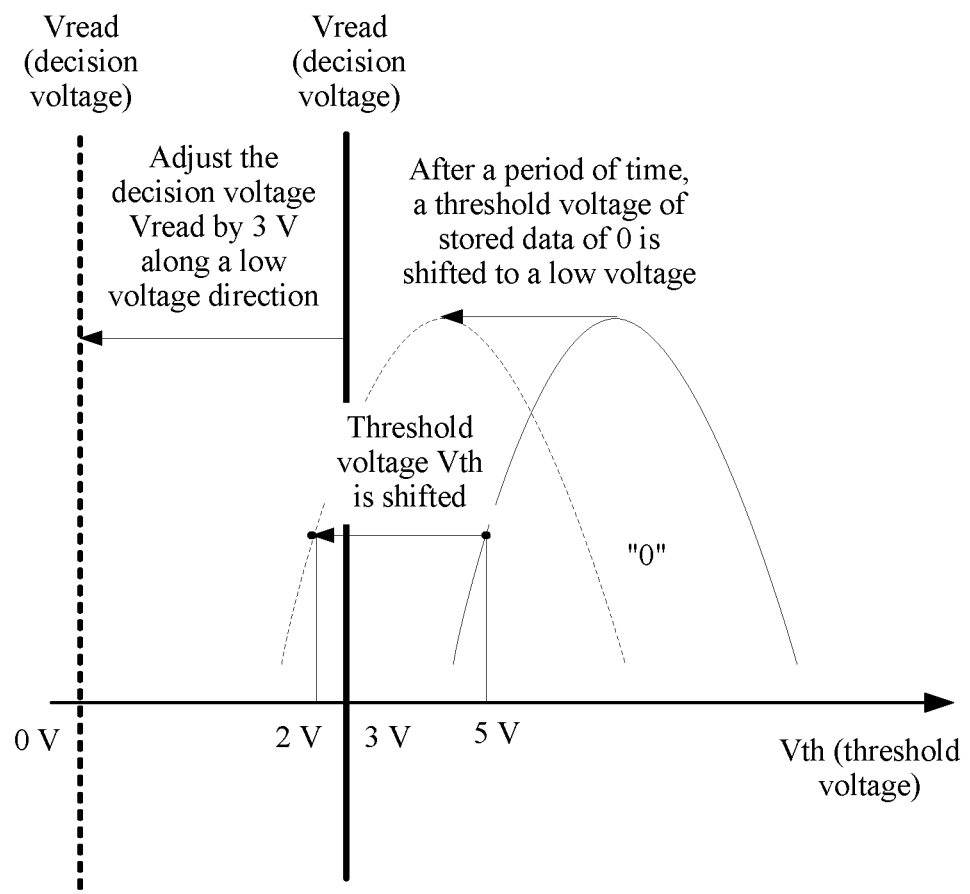
FIG. 4 is a schematic diagram of adjusting a decision voltage according to an embodiment of the present disclosure.

Optionally, the controller can determine a shift amount of the threshold voltage Vth of the storage unit based on the current threshold voltage Vth and the original threshold voltage Vth of the specific storage unit, and then the preset decision voltage Vread is shifted by the shift amount. For example, still referring to FIG. 1, it is assumed that specific data stored in a specific storage unit is 0, and an original threshold voltage Vth of the specific storage unit is 5 V, after a period of time, the threshold voltage Vth of the specific storage unit is changed to 2 V because electrons of the storage unit leak, and the shift amount of the threshold voltage Vth of the specific storage unit may be determined as 3 V (5 V−2 V=3 V). Correspondingly, a value of the decision voltage Vread may be shifted by a specific amount leftward, which may be shown in FIG. 4. In actual application, the specific storage unit may include a plurality of storage units, and in this embodiment of the present disclosure, a shift amount of the threshold voltage Vth of each storage unit (an SLC is used as an example for description, namely, a storage unit in a storage state of "0") that is in the specific storage unit and in which electrons leak may be first determined, and then an average of shift amounts of the threshold voltages Vth of these storage units is calculated. Further, the average may be calculated using an arithmetic average method or a weighted average method in the other approaches. Finally, a value of the decision voltage Vread is shifted based on the foregoing average.

Figure 5:
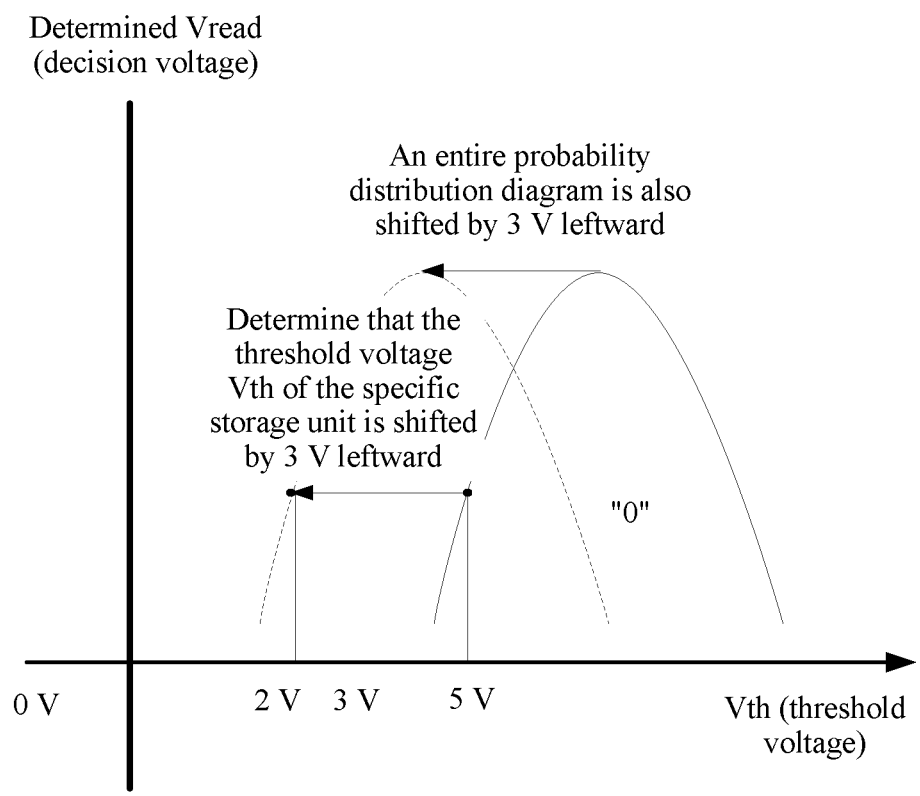
FIG. 5 is a schematic diagram of determining a decision voltage according to an embodiment of the present disclosure.

Optionally, the controller can prestore a probability distribution status of threshold voltages Vth of the specific data. For example, still referring to FIG. 1, for a flash device of an SLC type, probability distribution of threshold voltages Vth when the flash device of the SLC type stores data of "0" is shown in a right pattern in FIG. 1, and probability distribution of threshold voltages Vth when the flash device of the SLC type stores data of "1" is shown in a left pattern in FIG. 1. Then, a shift amount of the threshold voltage Vth of the specific storage unit is determined based on the original threshold voltage Vth and the current threshold voltage Vth of the specific storage unit. For details about how to calculate the shift amount of the threshold voltage Vth, refer to the foregoing description. Finally, a corresponding shift is performed on an overall probability distribution status of the threshold voltages Vth based on the shift amount of the currently calculated threshold voltage Vth, and the decision voltage Vread is determined based on the probability distribution status of the shifted threshold voltages Vth. For example, as shown in FIG. 5, when a shift value of the threshold voltage Vth of a specific storage unit is 3 V, the overall probability distribution status of the threshold voltages Vth is also correspondingly shifted by 3 V leftward. Finally, a minimum threshold voltage Vth is determined in the probability distribution status of the shifted threshold voltages Vth, and the decision voltage Vread is set to any value greater than the minimum threshold voltage Vth.

The controller reads, using the determined decision voltage Vread, the user data stored in the user storage unit.

It can be learned from the foregoing description that, in this embodiment of the present disclosure, in the foregoing method, the decision voltage Vread may be determined based on a real-time shift status of the threshold voltage Vth of the storage unit, thereby reducing incorrect determining of the data stored in the storage unit.

Embodiment 6

Figure 10:
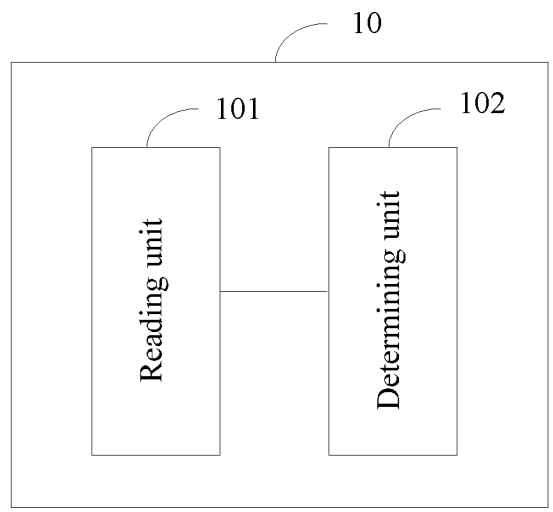
FIG. 10 is a schematic structural diagram of a flash device access apparatus according to an embodiment of the present disclosure.

The present disclosure further provides a flash device access apparatus, which corresponds to the foregoing method. The flash device includes at least a storage array, the storage array includes a specific storage unit and a user storage unit, the specific storage unit is configured to store specific data, the user storage unit is configured to store user data, and the specific data is used to determine a decision voltage for reading the user data. As shown in FIG. 10, the flash device access apparatus 10 includes at least a reading unit 101 configured to read the specific data stored in the specific storage unit, and a determining unit 102 configured to determine a decision voltage based on the read specific data, where the reading unit 101 is further configured to read, using the determined decision voltage, the user data stored in the user storage unit.

Optionally, when reading the specific data stored in the specific storage unit, the reading unit 101 is further configured to obtain a current threshold voltage of the specific storage unit, and compare a preset decision voltage with the current threshold voltage of the specific storage unit to determine the specific data stored in the specific storage unit.

Optionally, the determining unit 102 is further configured to calculate a bit error rate of the determined specific data, and use the preset decision voltage as the determined decision voltage when the bit error rate is less than a preset threshold.

Optionally, there are at least two preset decision voltages, and when reading the specific data stored in the specific storage unit, the reading unit 101 is further configured to compare each preset decision voltage with the current threshold voltage of the specific storage unit, to determine the specific data stored in the specific storage unit. The determining unit 102 is further configured to calculate a bit error rate of the specific data determined based on each preset decision voltage, and select a preset decision voltage corresponding to determined specific data with a minimum bit error rate as the determined decision voltage.

Optionally, when calculating the bit error rate of the determined specific data, the determining unit 102 is further configured to compare the determined specific data with recorded original specific data, to obtain the bit error rate of the determined specific data.

Optionally, the flash device access apparatus 10 may further include a wear unit (not shown) configured to perform a wear operation on the specific storage unit based on a wear feature of the user storage unit, such that a wear feature of the specific storage unit is the same as that of the user storage unit, or a rewriting unit (not shown) configured to synchronously rewrite the specific data into the specific storage unit when the user data is written into the user storage unit, such that a data storage duration feature of the specific storage unit is the same as that of the user storage unit.

It can be learned from the foregoing description that, in this embodiment of the present disclosure, the storage array is divided into the specific storage unit and the user storage unit in advance, the storage feature of the specific storage unit is the same as that of the user storage unit, shifts of the threshold voltages Vth of the specific storage unit and the user storage unit are the same, and therefore, decision voltages Vread used by the specific storage unit and the user storage unit tend to be the same. In addition, in this embodiment of the present disclosure, each time the controller reads the user data from the user storage unit, the controller reads the specific data stored in the specific storage unit and determines the decision voltage Vread based on the read specific data, and finally, the controller reads the user data stored in the user storage unit using the determined decision voltage Vread. Because the shifts of the threshold voltages Vth of the specific storage unit and the user storage unit tend to be the same, the data stored in the user storage unit is read using the determined decision voltage Vread in the specific storage unit, to reduce incorrect determining that is of the stored data and that is caused by the shift of the threshold voltage Vth.

Embodiment 7

The present disclosure further provides a flash device access apparatus, which corresponds to the foregoing method. The flash device includes at least a storage array, the storage array includes a specific storage unit and a user storage unit, the specific storage unit is configured to store specific data, the user storage unit is configured to store user data, the specific data is used to determine a decision voltage for reading the user data, and the apparatus includes an obtaining unit configured to obtain a current threshold voltage and an original threshold voltage of the specific storage unit, where the original threshold voltage is a threshold voltage of the specific storage unit when the specific data is written, a decision voltage determining unit configured to determine a decision voltage based on the current threshold voltage and the original threshold voltage of the specific storage unit, and a user data reading unit configured to read, using the determined decision voltage, the user data stored in the user storage unit.

It can be learned from the foregoing description that, in this embodiment of the present disclosure, in the foregoing method, the decision voltage Vread may be determined based on a real-time shift status of the threshold voltage Vth of the storage unit, thereby reducing incorrect determining of the data stored in the storage unit.

Embodiment 8

Figure 11:
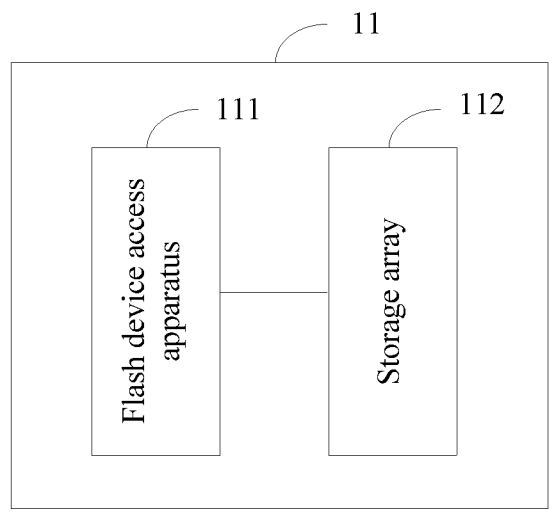
FIG. 11 is a schematic structural diagram of a flash device access system according to an embodiment of the present disclosure.

The present disclosure further provides a flash device access system, which corresponds to the foregoing method and apparatus. As shown in FIG. 11, a flash device access system 11 includes a flash device access apparatus 111 and a storage array 112.

The storage array 112 includes a specific storage unit (not shown) and a user storage unit (not shown), the specific storage unit is configured to store specific data, the user storage unit is configured to store user data, and the specific data is used to determine a decision voltage for reading the user data.

The flash device access apparatus 111 is configured to read the specific data stored in the specific storage unit, determine a decision voltage based on the read specific data, and read, using the determined decision voltage, the user data stored in the user storage unit.

Alternatively, the flash device access apparatus 111 is configured to obtain a current threshold voltage and an original threshold voltage of the specific storage unit, where the original threshold voltage is a threshold voltage of the specific storage unit when the specific data is written, determine a decision voltage based on the current threshold voltage and the original threshold voltage of the specific storage unit, and read, using the determined decision voltage, the user data stored in the user storage unit.

It can be learned from the foregoing description that, in this embodiment of the present disclosure, storage units of the storage array are classified into the specific storage unit and the user storage unit in advance, the storage feature of the specific storage unit is the same as that of the user storage unit, shifts of the threshold voltages Vth of the specific storage unit and the user storage unit are the same, and therefore, decision voltages Vread used by the specific storage unit and the user storage unit tend to be the same. In addition, in this embodiment of the present disclosure, each time the controller reads the user data from the user storage unit, the controller reads the specific data stored in the specific storage unit and determines the decision voltage Vread based on the read specific data, and finally, the controller reads the user data stored in the user storage unit using the determined decision voltage Vread. Because the shifts of the threshold voltages Vth of the specific storage unit and the user storage unit tend to be the same, the data stored in the user storage unit is read using the determined decision voltage Vread in the specific storage unit, to reduce incorrect determining that is of the stored data and that is caused by the shift of the threshold voltage Vth.

Embodiment 9

The present disclosure further provides a readable medium, which corresponds to the foregoing method. The readable medium includes an execution instruction. When a processor of a storage controller executes the execution instruction, the storage controller performs the flash device access methods disclosed in the foregoing embodiments.

Figure 12:
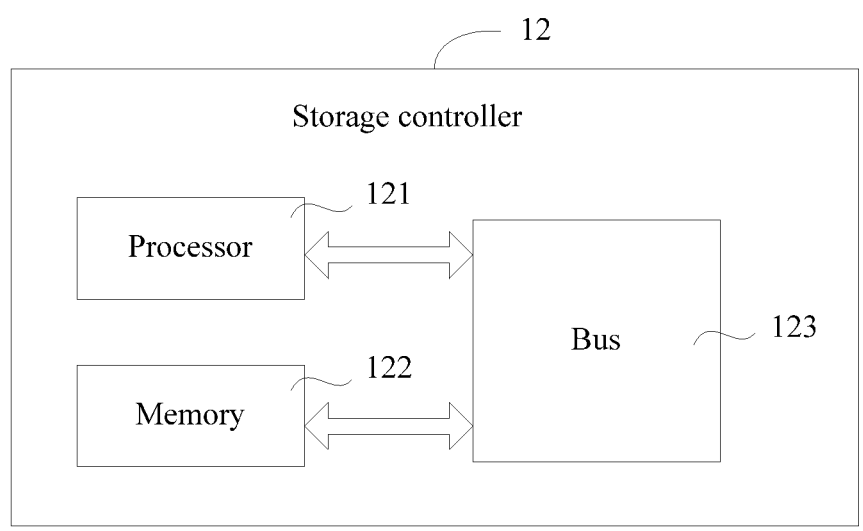
FIG. 12 is a schematic structural diagram of a storage controller according to an embodiment of the present disclosure.

The present disclosure further discloses a storage controller. As shown in FIG. 12, a storage controller 12 includes a processor 121, a memory 122, and a bus 123.

The memory 122 is configured to store an execution instruction, the processor 121 and the memory 122 are connected using the bus 123, and when the storage controller 12 runs, the processor 121 executes the execution instruction stored in the memory 122, such that the storage controller 12 performs the following operations of reading the specific data stored in the specific storage unit, determining a decision voltage based on the read specific data, and reading, using the determined decision voltage, the user data stored in the user storage unit.

Alternatively, the storage controller 12 performs the following operations of obtaining a current threshold voltage and an original threshold voltage of the specific storage unit, where the original threshold voltage is a threshold voltage of the specific storage unit when the specific data is written, determining a decision voltage based on the current threshold voltage and the original threshold voltage of the specific storage unit, and reading, using the determined decision voltage, the user data stored in the user storage unit.

It can be learned from the foregoing description that, in this embodiment of the present disclosure, storage units of the storage array are classified into the specific storage unit and the user storage unit in advance, the storage feature of the specific storage unit is the same as that of the user storage unit, shifts of the threshold voltages Vth of the specific storage unit and the user storage unit are the same, and therefore, decision voltages Vread used by the specific storage unit and the user storage unit tend to be the same. In addition, in this embodiment of the present disclosure, each time the controller reads the user data from the user storage unit, the controller reads the specific data stored in the specific storage unit and determines the decision voltage Vread based on the read specific data, and finally, the controller reads the user data stored in the user storage unit using the determined decision voltage Vread. Because the shifts of the threshold voltages Vth of the specific storage unit and the user storage unit tend to be the same, the data stored in the user storage unit is read using the determined decision voltage Vread in the specific storage unit, to reduce incorrect determining that is of the stored data and that is caused by the shift of the threshold voltage Vth.

Persons skilled in the art should understand that the embodiments of the present disclosure may be provided as a method, a system, or a computer program product. Therefore, the present disclosure may use a form of hardware only embodiments, software only embodiments, or embodiments with a combination of software and hardware. Moreover, the present disclosure may use a form of a computer program product that is implemented on one or more computer-usable storage media (including but not limited to a disk memory, a compact disc read-only memory (CD-ROM), an optical memory, and the like) that include computer-usable program code.

The present disclosure is described with reference to the flowcharts and/or block diagrams of the method, the device (system), and the computer program product according to the embodiments of the present disclosure. It should be understood that computer program instructions may be used to implement each process and/or each block in the flowcharts and/or the block diagrams and a combination of a process and/or a block in the flowcharts and/or the block diagrams. These computer program instructions may be provided for a general-purpose computer, a dedicated computer, an embedded processor, or a processor of any other programmable data processing device to generate a machine, such that the instructions executed by a computer or a processor of any other programmable data processing device generate an apparatus for implementing a specific function in one or more processes in the flowcharts and/or in one or more blocks in the block diagrams.

These computer program instructions may be stored in a computer readable memory that can instruct the computer or any other programmable data processing device to work in a specific manner, such that the instructions stored in the computer readable memory generate an artifact that includes an instruction apparatus. The instruction apparatus implements a specific function in one or more processes in the flowcharts and/or in one or more blocks in the block diagrams.

These computer program instructions may be loaded onto a computer or another programmable data processing device, such that a series of operations and steps are performed on the computer or the other programmable device, thereby generating computer-implemented processing. Therefore, the instructions executed on the computer or the other programmable device provides steps for implementing a specific function in one or more processes in the flowcharts and/or in one or more blocks in the block diagrams.

Although some embodiments of the present disclosure have been described, persons skilled in the art can make changes and modifications to these embodiments once they learn the basic inventive concept. Therefore, the following claims are intended to be construed as to cover the embodiments and all changes and modifications falling within the scope of the present disclosure.

Obviously, persons skilled in the art can make various modifications and variations to the embodiments of the present disclosure without departing from the spirit and scope of the embodiments of the present disclosure. The present disclosure is intended to cover these modifications and variations provided that they fall within the scope of protection defined by the following claims and their equivalent technologies.

What is claimed is:

1. A flash device access method, the method being applied to a flash device, and the method comprising:
   reading, by a controller, specific data stored in a specific storage unit, the flash device comprising the controller and a storage array, the storage array comprising the specific storage unit and a user storage unit, the specific storage unit being configured to store the specific data, and the user storage unit being configured to store user data;
   determining, by the controller, a decision voltage based on the read specific data;
   reading, by the controller using the determined decision voltage, the user data stored in the user storage unit;
   obtaining, by the controller, a quantity of wear operations performed on the user storage unit; and
   performing, by the controller, based on the obtained quantity of wear operations on the storage unit, the same quantity of wear operations on the specific storage unit.

2. The flash device access method of claim 1, wherein reading the specific data stored in the specific storage unit comprises:
   obtaining, by the controller, a current threshold voltage of the specific storage unit; and
   comparing, by the controller, a preset decision voltage with the current threshold voltage of the specific storage unit to determine the specific data stored in the specific storage unit.

3. The flash device access method of claim 2, wherein determining the decision voltage based on the read specific data comprises:
   calculating, by the controller, a bit error rate of the determined specific data; and
   setting, by the controller, the preset decision voltage as the determined decision voltage when the bit error rate is less than a preset threshold.

4. The flash device access method of claim 2, wherein there are at least two preset decision voltages, comparing the preset decision voltage with the current threshold voltage of the specific storage unit comprising comparing, by the controller, each preset decision voltage with the current threshold voltage of the specific storage unit to determine the specific data stored in the specific storage unit, and determining the decision voltage based on the read specific data comprising:
   calculating, by the controller, a bit error rate of the specific data determined based on each preset decision voltage; and
   selecting, by the controller, a preset decision voltage corresponding to determined specific data with a minimum bit error rate as the determined decision voltage.

5. The flash device access method of claim 1, wherein performing the same quantity of wear operations on the specific storage unit further comprises performing one wear operation each time the quantity is greater than zero.

6. The flash device access method of claim 1, wherein obtaining, by the controller, a quantity of wear operations performed on the user storage unit further comprises recording a count of wear operations, and wherein performing the same quantity of wear operations on the specific storage unit further comprises matching the count to a preset threshold.

7. The flash device access method of claim 1, wherein the controller allocates a plurality of specific storage units to each user storage unit, wherein when writing the user data into the user storage unit, specific data in a first specific storage unit is read and synchronously written into a second specific storage unit.

8. A flash device access apparatus, comprising:
a storage array comprising:
a specific storage unit configured to store specific data; and
a user storage unit configured to store user data;
a memory coupled to the storage array and configured to store instructions; and
a processor coupled to the memory, the instructions causing the processor to be configured to:
read the specific data stored in the specific storage unit;
determine a decision voltage based on the read specific data;
read, using the determined decision voltage, the user data stored in the user storage unit;
obtain a quantity of wear operations performed on the user storage unit; and
perform, based on the obtained quantity of wear operations on the user storage unit, the same quantity of wear operations on the specific storage unit.

9. The flash device access apparatus of claim 8, wherein the instructions further cause the processor to be configured to:
obtain a current threshold voltage of the specific storage unit; and
compare a preset decision voltage with the current threshold voltage of the specific storage unit to determine the specific data stored in the specific storage unit.

10. The flash device access apparatus of claim 9, wherein the instructions further cause the processor to be configured to:
calculate a bit error rate of the determined specific data; and
set the preset decision voltage as the determined decision voltage when the bit error rate is less than a preset threshold.

11. The flash device access apparatus of claim 9, wherein there are at least two preset decision voltages, and the instructions further causing the processor to be configured to:
compare each preset decision voltage with the current threshold voltage of the specific storage unit to determine the specific data stored in the specific storage unit;
calculate a bit error rate of the specific data determined based on each preset decision voltage; and
select a preset decision voltage corresponding to determined specific data with a minimum bit error rate as the determined decision voltage.

12. The flash device access apparatus of claim 8, wherein the instructions further cause the processor to be configured to perform one wear operation on the specific storage unit each time the obtained quantity is greater than zero.

13. The flash device access apparatus of claim 8, wherein the instructions further cause the processor to be configured to record a count of wear operations performed on the user storage unit, determine that the count reaches a preset threshold, and then perform the threshold count of wear operations on the specific storage unit.

14. The flash device access apparatus of claim 8, wherein the instructions further cause the processor to be configured to allocate a plurality of specific storage units to each user storage unit, wherein when writing the user data into the user storage unit, specific data in a first specific storage unit is read and synchronously written into a second specific storage unit.

15. A flash device, comprising:
a storage array comprising:
a specific storage unit configured to store specific data; and
a user storage unit configured to store user data; and
a controller coupled to the storage array and configured to:
read the specific data stored in the specific storage unit;
determine a decision voltage based on the read specific data;
read, using the determined decision voltage, the user data stored in the user storage unit;
obtain a quantity of wear operations performed on the user storage unit; and
perform, based on the obtained quantity of wear operations on the user storage unit, the same quantity of wear operations on the specific storage unit.

16. The flash device of claim 15, wherein the controller is further configured to:
obtain a current threshold voltage of the specific storage unit; and
compare a preset decision voltage with the current threshold voltage of the specific storage unit to determine the specific data stored in the specific storage unit.

17. The flash device of claim 16, wherein the controller is further configured to:
calculate a bit error rate of the determined specific data; and
set the preset decision voltage as the determined decision voltage when the bit error rate is less than a preset threshold.

18. The flash device of claim 16, wherein there are at least two preset decision voltages, and the controller being further configured to:
compare each preset decision voltage with the current threshold voltage of the specific storage unit to determine the specific data stored in the specific storage unit;
calculate a bit error rate of the specific data determined based on each preset decision voltage; and
select a preset decision voltage corresponding to determined specific data with a minimum bit error rate as the determined decision voltage.

19. The flash device of claim 17, wherein the controller is further configured to perform one wear operation on the specific storage unit each time the quantity is greater than zero.

20. The flash device of claim 15, wherein the controller is further configured to record a count of wear operations performed on the user storage unit, determine that the count reaches a preset threshold, and then perform the threshold count of wear operations on the specific storage unit.

* * * * *